United States Patent
Rodder et al.

(10) Patent No.: US 9,425,275 B2
(45) Date of Patent: Aug. 23, 2016

(54) INTEGRATED CIRCUIT CHIPS HAVING FIELD EFFECT TRANSISTORS WITH DIFFERENT GATE DESIGNS

(71) Applicant: Samsung Electronics Co., Ltd., Suwon-si, Gyeonggi-do (KR)

(72) Inventors: Mark S. Rodder, Dallas, TX (US); Dharmendar Reddy Palle, Austin, TX (US); Borna J. Obradovic, Leander, TX (US)

(73) Assignee: Samsung Electronics Co., Ltd. (KR)

(*) Notice: Subject to any disclaimer, the term of this patent is extended or adjusted under 35 U.S.C. 154(b) by 0 days.

(21) Appl. No.: 14/728,104

(22) Filed: Jun. 2, 2015

(65) Prior Publication Data

US 2015/0364556 A1    Dec. 17, 2015

Related U.S. Application Data

(60) Provisional application No. 62/012,124, filed on Jun. 13, 2014.

(51) Int. Cl.
*H01L 27/088* (2006.01)
*H01L 29/423* (2006.01)
*H01L 21/8234* (2006.01)

(52) U.S. Cl.
CPC ........ *H01L 29/4238* (2013.01); *H01L 27/0886* (2013.01); *H01L 21/823431* (2013.01); *H01L 21/823456* (2013.01)

(58) Field of Classification Search
USPC ............ 257/439, 443, 665, E27.1, E27.125, 257/E29.117, E29.145, E29.147, E29.151, 257/E29.182, E29.202, E29.273–E29.299, 257/E29.314, E29.32, E23.016, E21.094, 257/E21.404, E21.121, E21.372, 257/E21.411–E21.416, 135–136, E27.091, 257/E27.095–E27.096, E29.118, 20, 192, 257/194, E29.246–E29.253, 552–562, 257/E29.033, 7, 93, 427, 444, 446, 491, 257/663, 713, E29.255–E29.313, E29.315, 257/29.316, E21.409–E21.449, 257/E21.334–E21.346, 213–413, 900, 257/902–903, 163–166, 197, 205, 423, 474, 257/477, 517, 526, 539, 544, 565–593, 928, 257/E51.004, E31.069, E27.017, 257/E27.019–E27.023, E27.037–E27.043, 257/E27.053–E27.058, E27.074–E27.078, 257/E27.106, E27.149, E29.03–E29.035, 257/E29.044–E27.045, E29.114, E29.124; 438/149, 163, 136, 137, 156, 173, 192, 438/206, 212, 151, 198, 199, 201, 207, 216, 438/167, 172, 170, 189, 202, 309–378
See application file for complete search history.

(56) References Cited

U.S. PATENT DOCUMENTS 7,095,065 B2    8/2006  Yu et al.
7,498,208 B2 *  3/2009  Anderson ....... H01L 21/823807
                                                        438/150

(Continued)

OTHER PUBLICATIONS

Eitan N. Shauly, "CMOS Leakage and Power Reduction in Transistors and Circuits: Process and Layout Considerations," J. Low Power Electron Appl., 2, 1-29; doi:10.3390/jlpea2010001.

(Continued)

*Primary Examiner* — Dao H Nguyen
*Assistant Examiner* — Tram H Nguyen
(74) *Attorney, Agent, or Firm* — Myers Bigel & Sibley, P.A.

(57) ABSTRACT

An integrated circuit chip includes a semiconductor substrate, a first back-end-of-line unit circuit that includes a first group of field effect transistors, a second gate-loaded unit circuit that includes a second group of field effect transistors. The first group of field effect transistors includes a first transistor and the second group of field effect transistors includes a second transistor. A bottom surface of a gate electrode of the first transistor extends closer to a bottom surface of the semiconductor substrate than does a bottom surface of a gate electrode of the second transistor.

20 Claims, 7 Drawing Sheets

(56) References Cited

U.S. PATENT DOCUMENTS

| | | | |
|---|---|---|---|
| 7,935,601 B1 | 5/2011 | Neudeck | |
| 8,120,073 B2 | 2/2012 | Rakshit et al. | |
| 8,193,567 B2 * | 6/2012 | Kavalieros | H01L 21/823431 257/288 |
| 8,569,812 B2 | 10/2013 | Chang et al. | |
| 8,682,116 B2 * | 3/2014 | Schulz | H01L 31/0232 250/214.1 |
| 8,710,569 B2 | 4/2014 | Inoue et al. | |
| 8,729,615 B2 | 5/2014 | Lee et al. | |
| 8,766,364 B2 | 7/2014 | Doornbos et al. | |
| 2009/0014789 A1 | 1/2009 | Manabe | |
| 2009/0014795 A1 | 1/2009 | Koh et al. | |
| 2012/0305893 A1 | 12/2012 | Colinge | |

OTHER PUBLICATIONS

B. Tavel et al., 65 nm LP/GP Mix Low Cost Platform for Multi-Media Wireless and Consumer Applications, Solid-State Electronics 50 (2006) 573-578.

Thomas Skotnicki, et al, "Innovative Materials, Devices, and CMOS Technologies for Low-Power Mobile Multimedia," IEEE Transactions on Electron Devices, vol. 55, No. 1, Jan. 2008.

* cited by examiner

INTEGRATED CIRCUIT CHIPS HAVING FIELD EFFECT TRANSISTORS WITH DIFFERENT GATE DESIGNS

CROSS-REFERENCE TO RELATED APPLICATION

The present application claims priority under 35 U.S.C. §119 to U.S. Provisional Application Ser. No. 62/012,124, filed on Jun. 13, 2014, the entire content of which is incorporated herein by reference as if set forth in its entirety.

FIELD

The inventive concepts generally relate to semiconductor devices and, more particularly, to integrated circuit chips for low power, high performance applications.

BACKGROUND

There is an increasing demand for semiconductor integrated circuits that provide high performance (e.g., fast operating speeds) while exhibiting low power consumption and low fluctuation (e.g., low variation in the threshold voltages of the transistors included in the circuits on the chip). As the line widths on the chips are reduced to increase device integration, it has become increasingly difficult to achieve all three criteria.

SUMMARY

Pursuant to embodiments of the inventive concepts, integrated circuit chips are provided that include a semiconductor substrate, a first back-end-of-line unit circuit that includes a first group of field effect transistors, a second gate-loaded unit circuit that includes a second group of field effect transistors. The first group of field effect transistors includes a first transistor and the second group of field effect transistors includes a second transistor. A bottom surface of a gate electrode of the first transistor extends closer to a bottom surface of the semiconductor substrate than does a bottom surface of a gate electrode of the second transistor.

In some embodiments, the first transistor may be a pi-gate transistor and the second transistor may be a non-pi-gate transistor. In some embodiments, a gate capacitance of the first transistor may exceed a gate capacitance of the second transistor. In some embodiments, the leakage current of the first transistor may be less than the leakage current of the second transistor. In some embodiments, the first transistor may have a channel conduction width that is greater than a channel conduction width of the second transistor. In some embodiments, the first transistor may include a semiconductor fin that has a first height above the bottom surface of the substrate and the second transistor may include a semiconductor fin that has a second height above the bottom surface of the substrate that is less than the first height.

In some embodiments, the first and second field effect transistors may have the same gate length. In some embodiments, an effective drive current per layout area of the first transistor may exceed an effective drive current per layout area of the second transistor. A threshold voltage of the first transistor may exceed a threshold voltage of the second transistor.

In some embodiments, both first and second transistors may be pi-gate transistors. In some embodiments, the leakage current of the first transistor may be at least five times less than the leakage current of the second transistor.

Pursuant to further embodiments of the inventive concepts, integrated circuit chips are provided that include a semiconductor substrate, a first unit circuit that includes first unit cells having a first plurality of field effect transistors on the semiconductor substrate and a first plurality of interconnects that interconnect the first plurality of field effect transistors, and a second unit circuit that includes second unit cells having a second plurality of field effect transistors on the semiconductor substrate and a second plurality of interconnects that interconnect the second plurality of field effect transistors. A first transistor that is part of the first plurality of field effect transistors has a first gate design, and more than 50% of the circuit capacitance of the first unit circuit is attributable to the first plurality of interconnects. A second transistor that is part of the second plurality of field effect transistors has a second gate design, and less than 50% of the circuit capacitance of the second unit circuit is attributable to the second plurality of interconnects.

In some embodiments, the first transistor may have a pi-gate design and the second transistor may have a non-pi-gate design. A gate capacitance of the first transistor may exceed a gate capacitance of the second transistor. The leakage current of the first transistor may be less than the leakage current of the second transistor. For example, the leakage current of the first transistor may be at least five times less than the leakage current of the second transistor.

In some embodiments, the first transistor may have a channel conduction width that is greater than a channel conduction width of the second transistor. The first transistor may include a semiconductor fin that has a first height above a bottom surface of the substrate and the second transistor may include a semiconductor fin that has a second height above the bottom surface of the substrate that is less than the first height.

In some embodiments, the first and second field effect transistors may have the same gate length.

In some embodiments, the first and second transistors may both have pi-gate designs, and a bottom surface of a gate electrode of the first transistor may be positioned a first distance from the bottom surface of the semiconductor substrate and a bottom surface of a gate electrode of the second transistor may be positioned a second distance from the bottom surface of the semiconductor that is greater than the first distance.

DETAILED DESCRIPTION

Pursuant to embodiments of the inventive concepts, integrated circuit chips are provided that include multiple field effect transistor designs on the same integrated circuit chip. In these integrated circuit chips, the field effect transistor design used in a given unit circuit may be selected based on the ratio of the gate capacitances of the field effect transistors in the unit circuit to the capacitance of the interconnects that are used to electrically connect the field effect transistors. The integrated circuit chips according to embodiments of the inventive concepts may exhibit low power consumption while still providing high performance and low variation (fluctuation) in device characteristics such as the threshold voltages of the transistors included in the integrated circuit chip.

Figure 1:
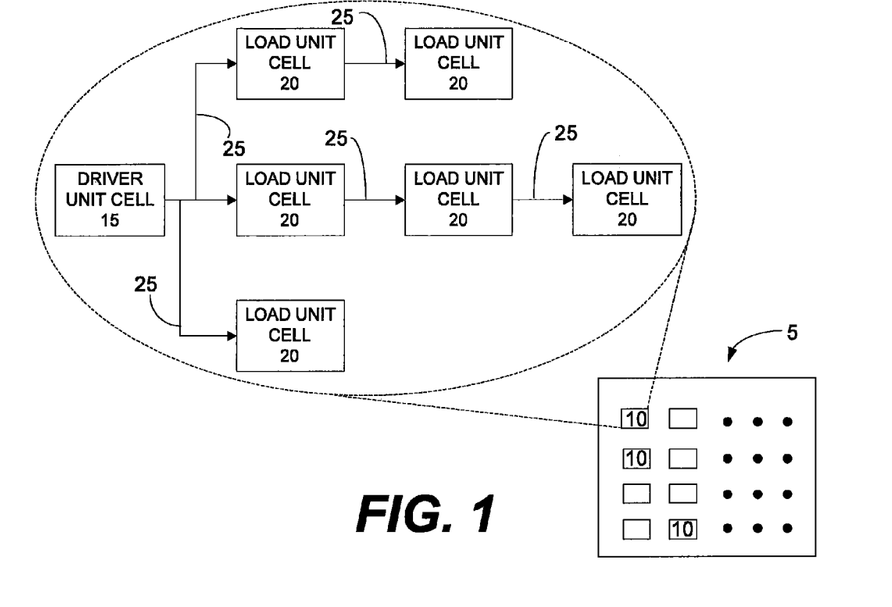
FIG. 1 is a block diagram that schematically illustrates the concept of a unit circuit of an integrated circuit chip.
Figure 2A:
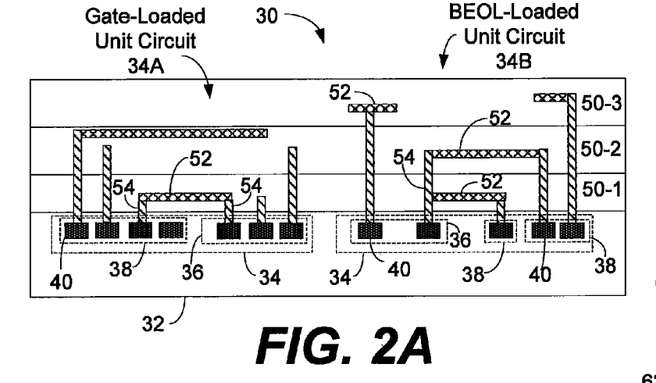
FIG. 2A is a schematic cross-sectional view of a small portion of an integrated circuit chip that schematically illustrates the interconnections to transistors of example unit circuits.
Figure 2B:
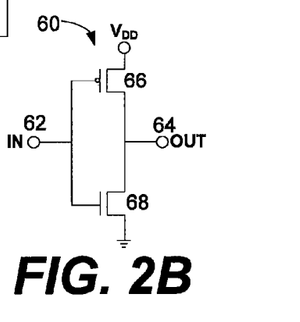
FIG. 2B is a schematic cross-sectional view of an example unit circuit.

FIG. 1 is a block diagram that schematically illustrates the concept of a unit circuit of an integrated circuit chip. As shown in FIG. 1, an integrated circuit chip 5 may include a plurality of unit circuits 10. The callout in FIG. 1 schematically illustrates one of the unit circuits 10 in more detail. As shown, the unit circuit 10 may be composed of a first unit cell 15, that is called the driver, and one or more additional unit cells 20, which are collectively referred to as the load. Each unit cell 15, 20 may be a small circuit such as an inverter, a NAND gate, a NOR gate, a single transistor or the like. An example unit cell in the form of an inverter circuit is shown in FIG. 2B. The one or more additional unit cells 20 of the load are connected to the output of the driver unit cell 15 by one or more interconnects 25. The interconnects 25 comprise conductive lines or regions (e.g., metal or semiconductor lines) along with conductive vias or other structures that electrically connect the conductive lines/regions in different layers of the device structure. A circuit is composed of multiple unit circuits 10 that are connected in series and/or in parallel. The "circuit capacitance" for a unit circuit 10 is defined herein as the sum of (1) the gate capacitances of the transistors in the driver unit cell 15, (2) the capacitance of all of the interconnects 25, and (3) the total gate capacitances of the transistors in all of the unit cells 20 that comprise the load. A unit circuit 10 is defined herein as a back-end-of-the-line-loaded unit circuit ("BEOL-loaded unit circuit") if the gate capacitance of the transistors in the driver unit cell 15 plus the gate capacitance of all of the transistors in the unit cells 20 in the load (i.e., the capacitance of elements (1) and (3) in the definition of "circuit capacitance" above) is less than 50% of the circuit capacitance for the unit circuit 10. A unit circuit 10 is defined herein as a gate-loaded unit circuit if the gate capacitance of the transistors of the driver unit cell 15 plus the gate capacitance of all of the transistors in the unit cells 20 of the load is at least 50% of the capacitance of the circuit capacitance for the unit circuit 10. An integrated circuit chip may often include both back-end-of-line-loaded unit circuits ("BEOL-loaded unit circuits") and gate-loaded unit circuits, which are also sometimes referred to as front-end-of-the-line-loaded unit circuits.

The effective drive current $I_{EFF}$ of a field effect transistor is related to various other properties of the field effect transistor. For example, $I_{EFF}$ is proportional to $C_{gate}*(V_g-V_T)^{n*veff}$ where $C_{gate}$ is the gate capacitance of the transistor, $V_g$ is the gate voltage, $V_T$ is the threshold voltage of the transistor, n is a constant, and veff is the effective carrier velocity. $I_{EFF}$ is also proportional to the device leakage current $I_{OFF}$, and the leakage power component of the integrated circuit chip ($P_{leak}$) is proportional to $I_{OFF}$. Additionally, the variation in the threshold voltage $V_T$ of a field effect transistor is proportional to doping levels in the transistor (e.g., the doping level in the fin of a finFET transistor), with the higher the doping, the higher the variation in the threshold voltage $V_T$.

One approach for achieving an integrated circuit chip that exhibits high performance, low power consumption and low variation is to provide a single field effect transistor design that has a high effective drive current $I_{EFF}$ and a low leakage current $I_{OFF}$ by, for example, maximizing veff while at the same time achieving low variation in the threshold voltage. However, this is not always easy to do, because, for example, this may require the use of new channel materials.

An integrated circuit chip will typically include both BEOL-loaded unit circuits and gate-loaded unit circuits. Pursuant to embodiments of the inventive concepts, different types of field effect transistor designs may be used to implement different types of circuits in an integrated circuit chip in order to provide enhanced performance. The type of field effect transistor used may be varied based on differences in the capacitive loading of the unit circuits.

In particular, as discussed above, in gate-loaded unit circuits, the capacitive loading is dominated by the gate capacitance $C_{gate}$ of the field effect transistors that are included in the unit cells, while in BEOL-loaded unit circuits, the capacitive loading is dominated by the capacitance of the metal interconnections of the multi-layer wiring structure that interconnects the transistors of the unit cells. Pursuant to embodiments of the inventive concepts, field effect transistor designs having different performance characteristics may be used in these two different types of unit circuits. For example, gate-loaded unit circuits may be fabricated using field effect transistors that have relatively low gate capacitance values, as this will increase transistor switching speeds. In contrast, the field effect transistors used in the BEOL-loaded unit circuits may have relatively low leakage currents, and relatively higher gate capacitance values. As the switching speed of the field effect transistors in the BEOL-loaded unit circuits may be dominated by the capacitance of the metal interconnections, the increase in the gate capacitance of these transistors may have only a minor impact on the performance of the integrated circuit chip, while the reduced leakage currents may reduce the power consumed by the integrated circuit chip. Thus, using the techniques according to embodiments of the inventive concepts, integrated circuit chips may be provided that exhibit both high performance and low power consumption.

In some embodiments, the field effect transistors may comprise finFET transistors. As is known to those of skill in the art, in order to increase device integration, semiconductor transistors have been developed which have a channel that is provided in a semiconductor "fin" structure, and a gate structure that surrounds the semiconductor fin on three sides. Because of this structure, the effective "width" of the channel may be significantly increased as compared to conventional planar field effect transistors in which the gate electrode is only on the top surface of the channel region, thereby allowing the use of semiconductor fins having smaller widths while maintaining the effective width of the channel, and hence the drive current of the transistor.

A number of different types of finFET transistors are known in the art. A first type is often referred to as a "tri-gate" field effect transistor, which herein will be used to refer to a finFET in which side portions of the gate structures that are on the opposed sidewalls of the semiconductor fin do not extend deeper into the substrate than the source/drain regions of the transistor. Another known type of finFET is the "pi-gate" transistor. A pi-gate transistor is similar to a tri-gate transistor, but in a pi-gate transistor, the side portions of the gate structure on the opposed sidewalls of the semiconductor fin extend deeper into the semiconductor substrate than do the source/drain regions of the transistor. Pi-gate transistors may exhibit lower leakage current levels than comparable tri-gate transistors.

The performance of gate-loaded unit circuits may be enhanced by implementing these circuits using field effect transistors that have a high value of $I_{EFF}/C_{gate}$. Thus, reducing or minimizing the gate capacitance $C_{gate}$ of the transistors may improve the performance of gate-loaded unit circuits. The gate capacitance of a field effect transistor will be a function of among other things, the size of the gate structure. Thus, reducing the size of the gate structure may generally act to increase the switching speed of the transistor.

As discussed above, for BEOL-loaded unit circuits, the circuit capacitance may primarily be a function of the capacitance ($C_{beol}$) of the interconnects in the form of back-end-of-line wiring that connect to the transistors in the driver and load unit cells thereof. In BEOL-loaded unit circuits, the gate capacitances $C_{gate}$ of the field effect transistors may have a reduced impact on the circuit capacitance. Thus, for BEOL-loaded unit circuits, the performance may be enhanced by implementing these circuits using field effect transistors that have a high value of $I_{EFF}/C_{beol}$.

As noted above, integrated circuit chips are desired that exhibit both high performance and provide for low power operation. The power requirements for an integrated circuit chip may be reduced by lowering the leakage power component ($P_{leak}$) of the total power of the integrated circuit chip. $P_{leak}$ is proportional to the leakage currents ($I_{OFF}$) of the transistors included in the circuits of the integrated circuit chip. Thus, the power requirements for an integrated circuit chip may be reduced by using field effect transistors that have low leakage currents ($I_{OFF}$). Pi-gate field effect transistors may generally exhibit low values of $I_{OFF}$, but also tend to have relatively high gate capacitances due to the larger gate electrode structures employed in such transistors.

According to embodiments of the inventive concepts, at least some of the BEOL-loaded unit circuits may be partially or fully implemented using pi-gate field effect transistors, while at least some of the gate-loaded unit circuits may be partially or fully implemented using non-pi-gate field effect transistors such as tri-gate transistors. The non-pi-gate transistors may provide for fast switching speeds, and the use of pi-gate transistors in the BEOL-loaded unit circuits may reduce the power requirements of the integrated circuit chip without a significant impact on performance. In other embodiments, both the gate-loaded unit circuits and the BEOL-loaded unit circuits may be implemented using pi-gate transistors, where at least some of the transistors in the BEOL-loaded unit circuits have gate structures that extend further below the source/drain regions than do the transistors in the gate-loaded unit circuits. In still other embodiments, multiple different types of pi-gate transistors as well as non-pi-gate transistors may be used in the same integrated circuit chip. These integrated circuit chip designs may exhibit both low power consumption and high speed performance.

Various aspects of the inventive concepts will now be described in further detail with reference to the attached figures, in which example embodiments of the inventive concepts are shown.

Integrated circuit chips typically include at least one semiconductor layer (e.g., the upper surface of a semiconductor substrate) that has a plurality of semiconductor transistors formed therein and a plurality of so-called back-end-of-the-line ("BEOL") metallization layers that are used to interconnect the transistors to each other, to other circuit elements (e.g., capacitors) included in the integrated circuit chip and to power supply and ground lines. The BEOL metallization layers are typically stacked above the transistors. FIG. 2A is a schematic cross-sectional view of a small portion of an integrated circuit chip that illustrates these different layers.

As shown in FIG. 2A, an integrated circuit chip 30 includes a semiconductor substrate 32 in which a plurality of unit circuits 34 are formed. Two very simple unit circuits 34 are shown in the highly simplified example of FIG. 2A. Each unit circuit 34 may include a plurality of unit cells in the form of a driver unit cell 36 and one or more load unit cells 38. Each of these unit cells 36, 38 may include one or more field effect transistors 40. A plurality of wiring layers 50-1 through 50-3 are provided on top of the substrate 32. In the present application, when a plurality of like elements are provided (e.g., wiring layers 50-1 through 50-3) the elements may be referred to individually by their full reference numeral (e.g., wiring layer 50-2) and collectively by the common first part of their reference numeral (e.g., the wiring layers 50). Metal lines 52 are provided in each of the wiring layers 50. Contact plugs 54 and other connection devices penetrate the wiring layers 50 to electrically contact, for example, terminals (i.e., the gate, source and drain) of the field effect transistors 40 included in the unit circuits 34. For simplicity, in FIG. 2A each field effect transistor 40 is illustrated by a single box, and only a single interconnection is shown for each transistor 40.

The unit cells 36, 38 shown in the integrated circuit chip 30 of FIG. 2A can constitute a wide variety of different types of circuits, and may comprise a single transistor (e.g., a switch circuit), multiple transistors (e.g., an inverter circuit, a flip-flop circuit, a NAND gate, a NOR gate, etc.) or transistor(s) and one or more other elements (e.g., a DRAM memory cell). For illustrative purposes, FIG. 2B is a circuit diagram of one example unit cell in the form of an inverter 60. The inverter 60 of FIG. 2 may be used to invert an input signal that is input to an input port terminal 62 by providing the inverse of the input signal at an output port 64. The inverter 60 includes a PMOS transistor 66 and an NMOS transistor 68. As shown in FIG. 2B, the drain of the PMOS transistor 66 is electrically connected to the drain of the NMOS transistor 68. The electrical connection between the drain of the PMOS transistor 66 and the drain of the NMOS transistor 68 may be implemented as, for example, a silicide contact (not shown) that is formed on the drain of the PMOS transistor 66 that extends onto the drain of the NMOS transistor 68. Likewise, the output port 64 of the inverter 60 may be electrically connected to one or more additional transistors (not shown) in the integrated circuit chip 30. This connection may be made, for example, by an electrical connection that extends through one or more of the metallization layers 50.

Referring again to FIG. 1,whether a particular unit circuit 10 is a BEOL-loaded unit circuit or a gate-loaded unit circuit will depend on, among other things, the amount of metal (or other conductive material) in the interconnects 25 for the unit circuit 10. A unit circuit 10 is more likely to be BEOL-loaded unit circuit if it includes numerous and/or relatively long interconnects and/or a relatively smaller number of transistors. Referring again to FIG. 2A, a first unit circuit 34 in the form of a gate-loaded circuit 34A is illustrated that includes a driver unit cell 36 and a single load unit cell 38. A BEOL-loaded unit circuit 34B is also illustrated in FIG. 2A that includes a driver unit cell 36 and two load unit cells 38.

As discussed above, pursuant to embodiments of the inventive concepts, at least some of the field effect transistors 40 in the gate-loaded unit circuits 34A may have a first design and at least some of the field effect transistors 40 in the BEOL-loaded unit circuits 34B may have a second design that is different from the first design. In some embodiments, the field effect transistors 40 that are included in the gate-loaded unit circuits 34A may have relatively low gate capacitance values that are conducive to fast switching speeds. The field effect transistors 40 that are included in the BEOL-loaded unit circuits 34B may exhibit higher gate capacitance levels, but have lower leakage currents. As the switching speed of the transistors in the BEOL-loaded unit circuits 34B may be dominated by the capacitance of the metal interconnections 52, 54, the increased gate capacitance of these transistors may have little impact on circuit performance, while the reduced leakage currents may decrease the power consumed by the integrated circuit chip. In some embodiments, the gate-loaded unit circuits 34A may be primarily implemented using tri-gate transistors while the BEOL-loaded unit circuits 34-2 may be primarily implemented using pi-gate transistors.

Figure 3:
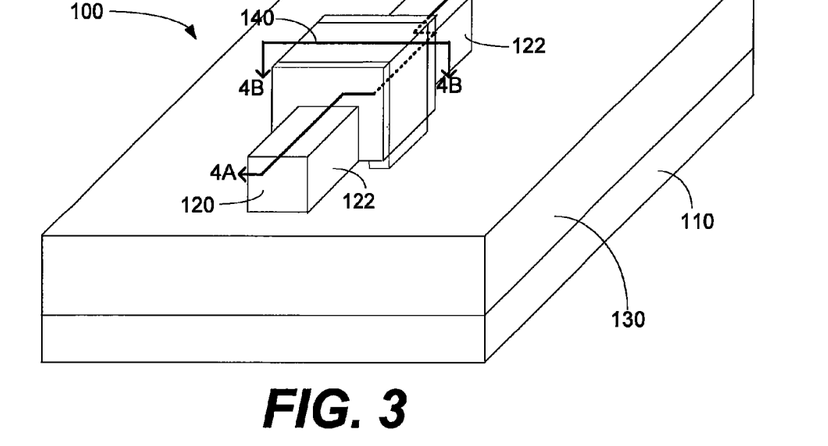
FIG. 3 is a schematic perspective view of a pi-gate field effect transistor that may be used to implement back-end-of-line loaded unit circuits according to embodiments of the inventive concepts.
Figure 4A:
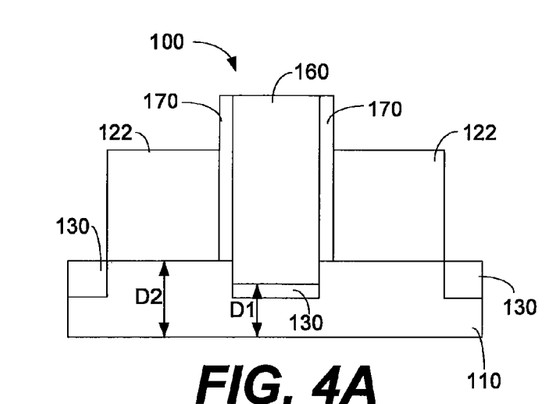
FIG. 4A is a cross-sectional view of the pi-gate field effect transistor of FIG. 3 taken along the line 4A-4A.
Figure 4B:
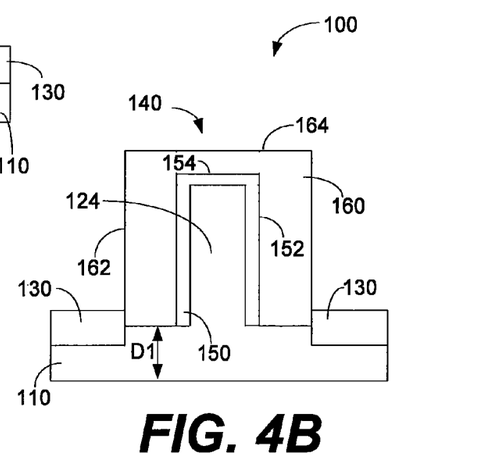
FIG. 4B is a cross-sectional view of the pi-gate field effect transistor of FIG. 3 taken along the line 4B-4B.

FIG. 3 is a schematic perspective view of a pi-gate field effect transistor 100. The field effect transistor 100 may be used to implement at least some of the field effect transistors 40 in the BEOL-loaded unit circuit 34B of the integrated circuit chip 30 of FIG. 2A. FIG. 4A is a cross-sectional view of the pi-gate field effect transistor 100 of FIG. 3 taken along the line 4A-4A of FIG. 3. FIG. 4B is a cross-sectional view of the pi-gate field effect transistor 100 of FIG. 3 taken along the line 4B-4B of FIG. 3.

Referring to FIGS. 3 and 4A-B, the pi-gate field effect transistor 100 comprises a semiconductor body 120 that is formed on a semiconductor substrate 110. The semiconductor substrate 110 may be any semiconducting material such as, for example, silicon, silicon-germanium, germanium, gallium arsenide, indium arsenide, other III-V compound semiconductor materials and/or II-VI compound semiconductor materials. In some embodiments, the semiconductor substrate 110 may contain silicon and may be a bulk silicon substrate or a silicon layer on an underlying substrate. The semiconductor material may be amorphous, polycrystalline or single-crystalline material, or combinations thereof. The semiconductor material may be on an insulator such as, for example a silicon-on-insulator substrate. The semiconductor material in the semiconductor substrate 110 may be a strained semiconductor material in some embodiments.

The semiconductor body 120 may comprise a semiconductor fin 120 that protrudes upwardly from the semiconductor substrate 110. In some embodiments, the semiconductor fin 120 may be formed by forming a mask above the region of the semiconductor substrate 110 where the semiconductor fin 120 is to be formed and then selectively etching the semiconductor substrate 110 to remove the top portion of the semiconductor substrate 110 except for the top portion of the semiconductor substrate 110 that is under the mask in order to form the semiconductor fin 120. In other embodiments, selective epitaxial growth may be used.

An isolation layer 130 may be selectively formed on the semiconductor substrate 110 to isolate the pi-gate field effect transistor 100 from other transistors and devices (not shown) that are also formed on the semiconductor substrate 110. The isolation layer 130 may comprise, for example, a shallow trench isolation layer formed of, for example, an oxide. The isolation layer 130 may extend on and, in some cases, may cover, the lower sidewalls of the semiconductor fin 120 while leaving upper portions of the sidewalls of the semiconductor fin 120 exposed.

A gate structure 140 may extend on and/or cover the top surface and sidewalls of a middle portion of the semiconductor fin 120. The gate structure 140 includes a gate dielectric layer 150 and a gate electrode 160. The gate dielectric layer 150 includes side portions 152 and a top portion 154. The gate electrode 160 includes side portions 162 and a top portion 164. The gate dielectric layer 150 may comprise, for example, an oxide, an oxynitride, a nitride and/or a high-k dielectric material such as, for example, hafnium oxide. The gate dielectric layer 150 may be formed by any suitable technique including, for example, chemical vapor deposition ("CVD"), atomic layer deposition, pulsed CVD, plasma-assisted CVD, sputtering, e-beam deposition and/or solution deposition. Alternatively, the gate dielectric layer 150 may be formed using a thermal growth process such as oxidation, oxynitridation, nitridation and/or plasma treatment.

The gate electrode 160 may comprise, for example, a metal gate electrode. The gate electrode 160 may comprise an n-type or p-type work function metal layer, depending upon whether the transistor is an NMOS or a PMOS transistor. The n-type work function metal layer may have a work function between about 3.7 eV and about 4.4 eV such as hafnium, zirconium, titanium, tantalum, aluminum, and/or metal carbides that include these metals. The p-type work function metal layer may have a work function between about 4.7 eV and 5.3 eV such as ruthenium, palladium, platinum, cobalt, nickel, and/or conductive metal oxides thereof. The gate electrode 160 may also comprise a multi-layer structure in some embodiments that additionally includes, for example, a metal barrier layer.

Source/drain regions 122 are formed in the semiconductor fin 120 on either side of the gate structure 140. A channel region 124 is provided in the semiconductor fin 120 in between the source/drain regions 122 and underneath the gate structure 140. In some embodiments, the source/drain regions 122 may be formed by ion implantation. Source/drain extension regions may also be provided between each source/drain region 122 and the channel region 124.

Field effect transistors having a semiconductor fin (referred to herein as "finFET transistors") such as the transistor 100 of FIGS. 3 and 4A-B may have a gate electrode that wraps around three sides of the channel region. This wrap-around gate electrode design may provide better electrical control over the channel and thus help in reducing leakage currents and mitigating other undesirable short-channel effects. One potential issue with finFET transistors, however, is that the bottom of the channel region may still give rise to short channel effects, particularly if the source/drain regions extend to the same depth or deeper into the substrate than the gate structure. Pi-gate transistors such as the transistor 100 of FIGS. 3 and 4A-B may reduce or eliminate the problem of short channel effects along the bottom of the channel.

In particular, a field effect transistor having a pi-gate design such as the transistor 100 may have a gate structure 140 that extends deeper into the device (i.e., closer to a bottom surface of the substrate 110 that is opposite the isolation layer 130) than the channel region 124. As shown in FIGS. 3 and 4A-B, this may be accomplished, for example, by recessing the portions of the isolation layer 130 that are underneath the side portions 152 of the gate dielectric layer 150 and the side portions 162 of the gate electrode 160 so as to allow the side portions 152 of the gate dielectric layer 150 and the side portions 162 of the gate electrode 160 to each extend deeper into the device and effectively below a bottom surface of the channel region 124. In particular, as shown in FIGS. 4A-B, the bottom surfaces of the source/drain regions 122 may each be a distance D2 from the bottom surface of the substrate 110. In contrast, the side portion 152 of the gate dielectric layer 150 and the side portion 162 of the gate electrode 160 may be a distance D1 from the bottom surface of the substrate 110, where D1 is less than D2. This design may result in reduced leakage current, but also may cause the transistor 100 to exhibit an increased gate capacitance $C_{gate}$ due to the larger gate electrode 160. The transistor 100 may be used to implement some or all of the transistors in the BEOL-loaded unit circuits 34B of the integrated circuit chip 30.

Figure 5:
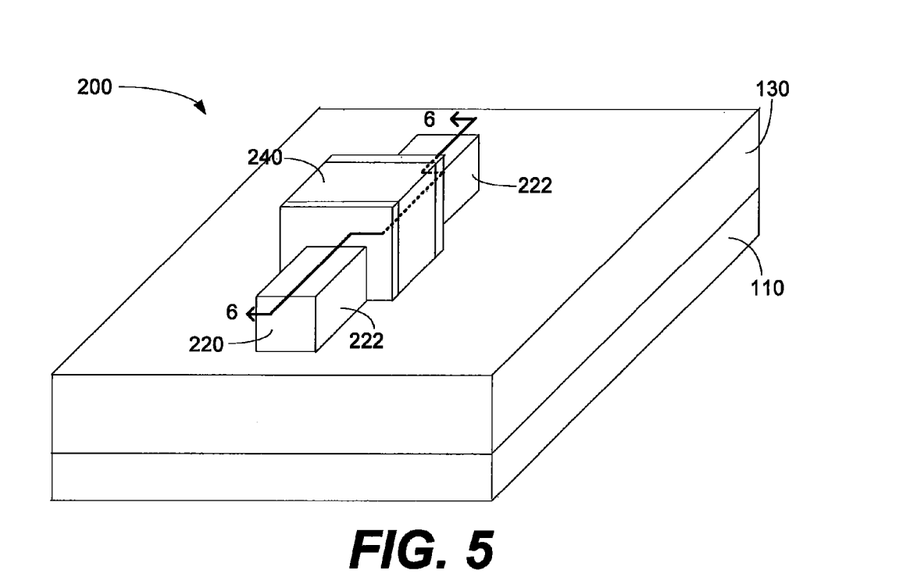
FIG. 5 is a schematic perspective view of a non-pi-gate field effect transistor that may be used to implement gate-loaded unit circuits according to embodiments of the inventive concepts.
Figure 6:
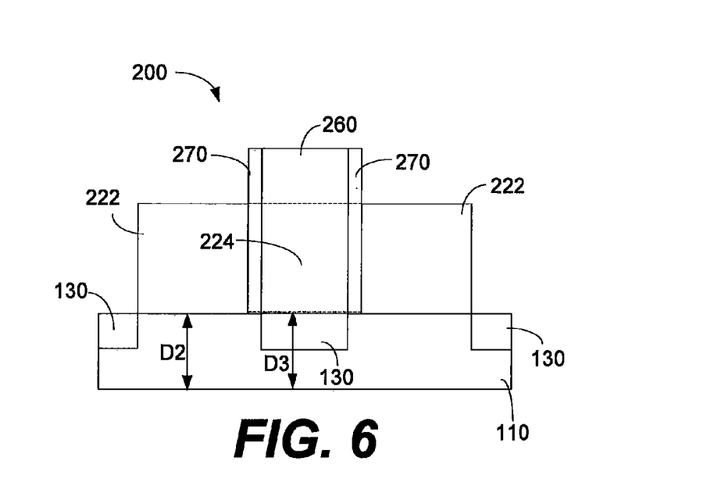
FIG. 6 is a cross-sectional view of the non-pi-gate field effect transistor of FIG. 5 taken along the line 6-6.

FIG. 5 is a schematic perspective view of a tri-gate field effect transistor 200. The field effect transistor 200 may be used to implement at least some of the field effect transistors 40 in the gate-loaded unit circuits 34A of the integrated circuit chip 30 of FIG. 2A. FIG. 6 is a cross-sectional view of the tri-gate field effect transistor 200 of FIG. 5 taken along the line 6-6 of FIG. 5.

Referring to FIGS. 5 and 6, the tri-gate field effect transistor 200 comprises a semiconductor body 220 that is formed on a semiconductor substrate 110. The semiconductor substrate 110 may be the same semiconductor substrate 110 as is shown in FIGS. 3 and 4A-B, as the pi gate transistor 100 and the tri-gate transistor 200 may be implemented on the same integrated circuit chip. The semiconductor body 220 may comprise a semiconductor fin 220 that protrudes upwardly from the substrate 110. The isolation layer 130 isolates the non-pi-gate field effect transistor 200 from other transistors and devices (not shown) that are also formed on the substrate 110. The isolation layer 130 may be the same isolation layer 130 that is shown in FIGS. 3 and 4A-B. The isolation layer 130 may cover lower sidewalls of the semiconductor fin 220 while leaving upper portions of the sidewalls of the semiconductor fin 220 exposed.

A gate structure 240 covers the top surface and sidewalls of a middle portion of the semiconductor fin 220. The gate structure 240 includes a gate dielectric layer (not visible) and a gate electrode 260. The gate dielectric layer includes side portions and a top portion. The gate electrode 260 includes side portions 262 and a top portion 264. The gate dielectric layer may comprise, for example, any of the materials listed above which may be used to form the gate dielectric layer 150 of the pi-gate transistor 100. The gate electrode 160 may comprise, for example, any of the materials listed above which may be used to form the gate electrode 160 of the pi-gate transistor 100.

Source/drain regions 222 are formed in the semiconductor fin 220 on either side of the gate structure 240. A channel region 224 (shown in dotted lines in the cross section of FIG. 6 since the middle portion of the cross section is through the gate electrode 260 as opposed to the channel region 224) is provided in the semiconductor fin 220 in between the source/drain regions 222 and underneath the gate structure 240. In some embodiments, the source/drain regions 222 may be formed by ion implantation. Source/drain extension regions may also be provided between each source/drain region 222 and the channel region 224.

Referring still to FIG. 6, bottom surfaces of the side portions of the gate dielectric layer and side portions 262 of the gate electrode 260 may each be a distance D3 from the bottom surface of the semiconductor substrate 110, where D3 is larger than D1 (where D1 is the distance that the side portion of the gate dielectric layer 152 and the side portion of the gate electrode 164 of the pi-gate transistor 100 of FIGS. 3 and 4A-B are spaced apart from the bottom surface of the semiconductor substrate 110). In some embodiments, the bottom surfaces of the source/drain regions 222 may be substantially coplanar with the bottom surfaces of the gate dielectric layer 250 and the gate electrode 260 (i.e., D2 D3). The gate capacitance of the tri-gate transistor 200 will, all else being equal, be less than the gate capacitance of the pi-gate transistor 100 due to the reduced length of the side portions 262 of the gate electrode 260 as compared to the side portions 162 of the gate electrode 160.

As discussed above, with respect to the gate-loaded unit circuits 34A of integrated circuit chip 30, the circuit capacitance will typically be dominated by the gate capacitance $C_{gate}$ of the transistors 40, and hence the CMOS inverter delay for the field effect transistors 40 included in these gate-loaded unit circuits 34A may be reduced by providing field effect transistors 40 that have a high value of $I_{EFF}/C_{gate}$. Thus, reducing the gate capacitance $C_{gate}$ of the transistors 40 may improve (decrease) the CMOS inverter delay of the transistors in these gate-loaded unit circuits 34A. As discussed above, all else being equal, a pi-gate transistor (e.g., the transistor 100 of FIGS. 3 and 4A-B) will have increased gate capacitance as compared to a tri-gate transistor (e.g., the transistor 200 of FIGS. 5-6) due to the larger gate electrode included in the pi-gate transistor 100, and hence tri-gate transistors such as the transistor 200 of FIGS. 5-6, or other non-pi-gate transistors, may be used in the gate-loaded unit circuits 34A in order to provide improved switching speeds.

By using tri-gate transistors 200 to implement the transistors 40 in the gate-loaded unit circuits 34A, the integrated circuit chip 30 may achieve high switching speeds (high performance). By using the pi-gate transistors 100 to implement the transistors 40 in the BEOL-loaded unit circuits 34B, the integrated circuit chip 30 may have reduced leakage currents, and hence lower power consumption. Moreover, since the circuit capacitance of the BEOL-loaded unit circuits 34B may be dominated by the BEOL metallization, the increase in the circuit capacitance of the BEOL-loaded unit circuits 34B that results from the use of pi-gate transistors 100 may be minimal Accordingly, the use of pi-gate transistors 100 to implement the BEOL-loaded unit circuits 34B may have little negative impact on the performance of the integrated circuit chip 30.

In some embodiments, the pi-gate transistors 100 and the tri-gate transistors 200 that are used in the respective BEOL-loaded and gate-loaded unit circuits 34B, 34A may have the same gate length. Herein, the "gate length" refers to the length of the gate electrode as measured along an axis of the channel that connects the source to the drain.

Figures 7, 8:
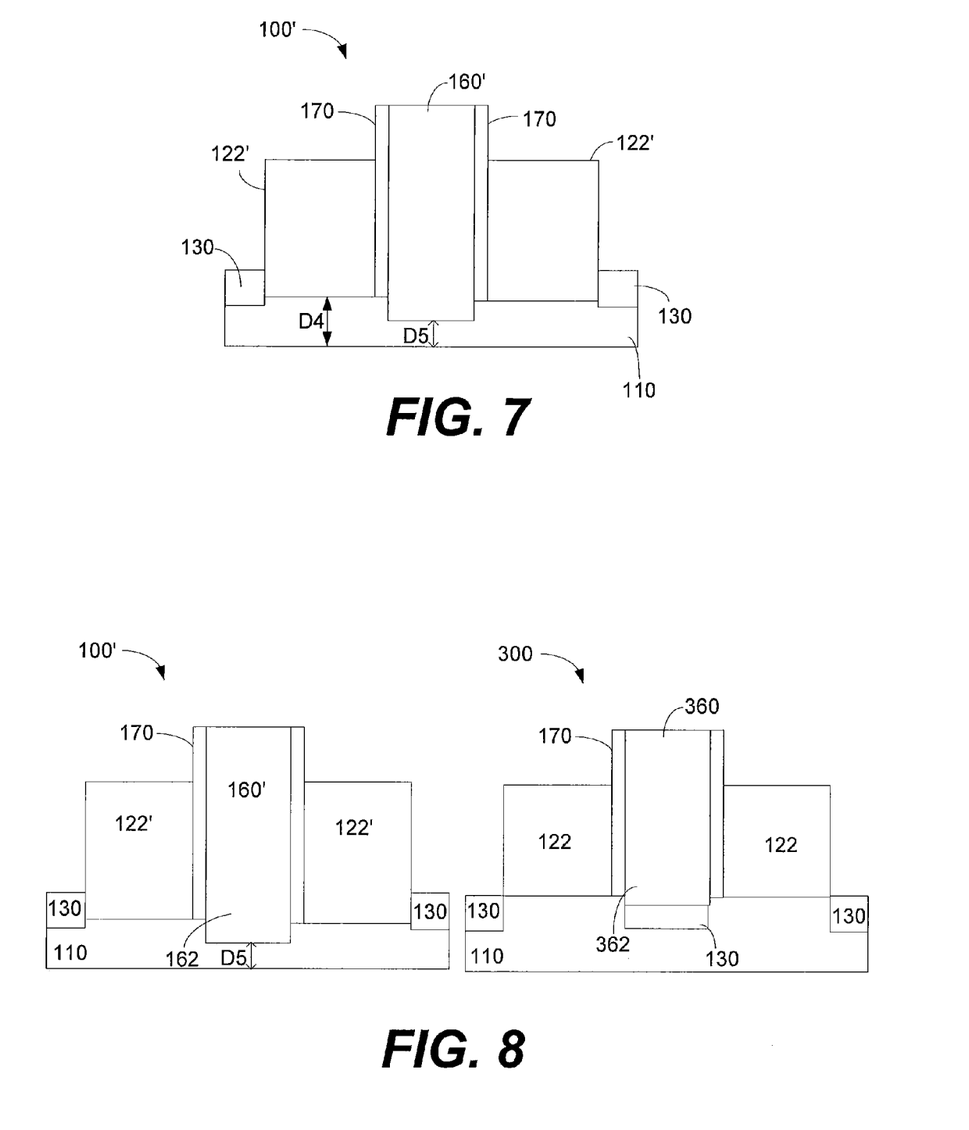
FIG. 7 is a cross-sectional view of an alternative pi-gate field effect transistor design that may be used in place of or in addition to, the transistor illustrated in FIGS. 3 and 4A-B.
FIG. 8 shows cross-sectional views of two pi-gate field effect transistors that have different designs that may be used in integrated circuit chips according to further embodiments of the inventive concepts.

FIG. 7 is a cross-sectional view of an alternative pi-gate field effect transistor 100' that has a larger channel conduction width that may be used in place of the pi-gate transistor 100 illustrated in FIGS. 3, 4A and 4B in some embodiments.

As can be seen by comparing FIGS. 4A and 7, the pi-gate transistor 100' is almost identical to the pi-gate transistor 100. However, the source/drain regions 122' of the pi-gate transistor 100' extend deeper into the semiconductor substrate 110 than the source drain regions 122 of the pi-gate transistor 100 and/or of the non-pi-gate transistor 200. Thus, the bottom surface of the source/drain region 122' is a distance D4 from the bottom surface of the substrate, where D4 is less than the distance D2. As discussed above, the effective channel width for a finFET transistor is a function of both the width of the semiconductor fin 120 and the height of the fin 120. As the semiconductor fin in the transistor 100' has a larger height since the source/drain regions 122' extend deeper into the semiconductor substrate 110, the effective channel width of the transistor 100' will be greater than the effective channel width of the semiconductor 100 (and also will be larger than the channel width of the tri-gate transistor 200). The pi-gate transistor 100' may exhibit a higher gate capacitance $C_{gate}$, a higher threshold voltage $V_T$, and a lower leakage current $I_{OFF}$ as compared to the tri-gate transistor 200. As the source/drain regions 122' of the pi-gate transistor 100' extend deeper into the semiconductor substrate 110, the bottom surface of the gate electrode 160' also extends deeper into the semiconductor substrate 110 than do the gate electrodes in the transistors 100 and 200 described above. Accordingly, the distance D5 from the bottom surface of the gate electrode 160' of transistor 100' to the bottom surface of the semiconductor substrate 110 may be less than the corresponding distances D1 and D3 for the transistors 100 and 200 described above.

According to further embodiments of the inventive concepts, integrated circuit chips are provided that may use pi-gate transistors for at least some of the field effect transistors in both the gate-loaded unit circuits and in the BEOL-loaded unit circuits. In these integrated circuit chip designs, the gate structures on the field effect transistors of the BEOL-loaded unit circuits may have effective channel widths that exceed the effective channel widths of the field effect transistors included in the gate-loaded unit circuits by, for example, providing source/drain regions that extend deeper into the semiconductor substrate 110 in the transistors used in the BEOL-loaded unit circuits. Additionally, the side portions of the gate dielectric layer and gate electrode may extend farther below the bottom surfaces of the source/drain regions in the transistors included in the BEOL-loaded unit circuits as compared to the transistors included in the gate-loaded circuits.

FIG. 8 is a comparative diagram showing cross-sectional views of a field effect transistor of a gate-loaded unit circuit and a field effect transistor of a BEOL-loaded unit circuit that are included in such an integrated circuit device. As shown in FIG. 8, the transistors included in the BEOL-loaded unit circuits may have the design of the transistor 100' of FIG. 7. Pi-gate transistors 300 may be included in the gate-loaded unit circuits. The pi-gate transistors 300 are similar to the pi-gate transistors 100 discussed above with reference to FIGS. 3 and 4A-B, except that the side portions 362 of the gate electrode 360 (and the gate dielectric layer as well, which is not visible in FIG. 8) do not extend as deep into the device as do the corresponding side portions 152, 162 of the gate dielectric layer 150 and gate electrode 160 of transistor 100. The shorter gate electrode sidewalls may reduce the gate capacitance of the transistors 300 as compared to the transistors 100.

Table 1 summarizes the characteristics of the field effect transistor designs that may be used in the integrated circuit chips according to embodiments of the inventive concepts.

TABLE 1

| FET Design | $C_{EFF}$ | $I_{OFF}$ | $I_{EFF}$/Layout Area | $V_T$ | Used In: |
|---|---|---|---|---|---|
| FET Design 1 | Higher | Lower | Higher | Higher | BEOL-Loaded |
| FET Design 2 | Lower | Higher | Lower | Lower | Gate-Loaded |

As discussed above, in some embodiments, FET Design 1 may correspond to pi-gate finFET transistors, while FET Design 2 may correspond to non-pi-gate finFET transistors.

In other embodiments, FET Design 1 may correspond to pi-gate finFET transistors having relatively larger channel conduction widths, while FET Design 2 may correspond to pi-gate finFET transistors having relatively smaller channel conduction widths. Other variations will be apparent to those of skill in the art in light of the present disclosure. FET Design 1 and FET Design 2 may each be implemented as both p-type field effect transistors and as n-type field effect transistors.

The use of two different field effect transistor designs may also help reduce variability in the threshold voltages of the transistors in two different ways. First, the use of a pi-gate field effect transistors to implement "regular" threshold voltage transistors in some unit circuits (i.e., transistors that do not require low or very-low threshold voltages) allows the doping in the fins of these transistors to be very low. If non-pi-gate transistors were used instead, the transistors would typically have more heavily-doped sub-fin regions in order to suppress leakage currents. Some of this sub-fin doping may diffuse into the fins during manufacturing, raising the threshold voltages of the transistors. Transistors in which some (and possibly a large part) of the threshold voltage is set by channel doping are subject to increased variability in the threshold voltage due to Random Dopant Fluctuation (RDF), which can typically only be suppressed by engineering the threshold voltage of the transistor to be as independent of doping as possible. Thus, the pi-gate transistors that have low fin doping will generally exhibit reduced variability in the threshold voltage. Second, low threshold voltage transistors tend to have less RDF, because such transistors have reduced sub-fin (or fin) doping. As low threshold voltage transistors are more likely to be used in gate-loaded unit circuits, both the BEOL-loaded unit circuits and the gate-loaded unit circuits may generally have low threshold voltage variability.

In some embodiments, the BEOL-loaded unit circuits may use a field effect transistors that have an average leakage current $I_{OFF}$ that is at least twice as low as the average leakage current of the field effect transistors used in the gate-loaded unit circuits. In other embodiments, the BEOL-loaded unit circuits may use field effect transistors that have an average leakage current $I_{OFF}$ that is at least five times lower than the average leakage current of the field effect transistors used in the gate-loaded unit circuits. In still other embodiments, the BEOL-loaded unit circuits may use field effect transistors that have an average leakage current $I_{OFF}$ that is at least ten times as low as the average leakage current of the field effect transistors used in the gate-loaded unit circuits.

According to further embodiments of the inventive concepts, the transistor design that is selected for different unit circuits may be based on the percentage of the total capacitance that is due to the interconnects as opposed to being based on whether or not a unit circuit is a BEOL-loaded or a gate-loaded unit circuit. This approach recognizes that in some integrated circuit chips the percentage of the circuit capacitance that is due to, for example, the interconnects should be set at a different level than the levels defined above for defining whether a unit circuit is a gate-loaded or a BEOL-loaded unit circuit. For example, in one embodiment using this approach, a unit circuit of an integrated circuit chip may be implemented using pi-gate transistor designs if the sum of the gate capacitances of the transistors in the unit circuit is less than 60% of the total circuit capacitance, and a unit circuit of the integrated circuit chip may be implemented using non-pi-gate transistors if the sum of the gate capacitances of the transistors in the unit circuit is more than 40% of the total circuit capacitance. Other values be used in further embodiments, such as, for example, 45%/55% or 40%/60% or 55%/45%.

Pi-gate transistor designs generally have not been used in integrated circuit chips because the reduction in leakage current provided by the gate design is typically insufficient to justify the reduction in performance that results from the increased gate capacitance. Pursuant to embodiments of the inventive concepts, it has been discovered that in certain types of circuits such as BEOL-loaded unit circuits, the increased gate capacitance does not substantially impact circuit performance as other capacitances within the circuit dominate the CMOS inverter delay characteristics of the field effect transistors. Accordingly, by implementing BEOL-loaded unit circuits using at least some pi-gate transistors while implementing gate-loaded unit circuits of the same integrated circuit chip using at least some non-pi-gate field effect transistors, an integrated circuit chip may be provided that maintains a high level of performance, reduced power consumption and low variation.

FIGS. 9A-D and 9F are schematic perspective views illustrating a method of fabricating an integrated circuit chip according to further embodiments of the inventive concepts.

Figure 9A:
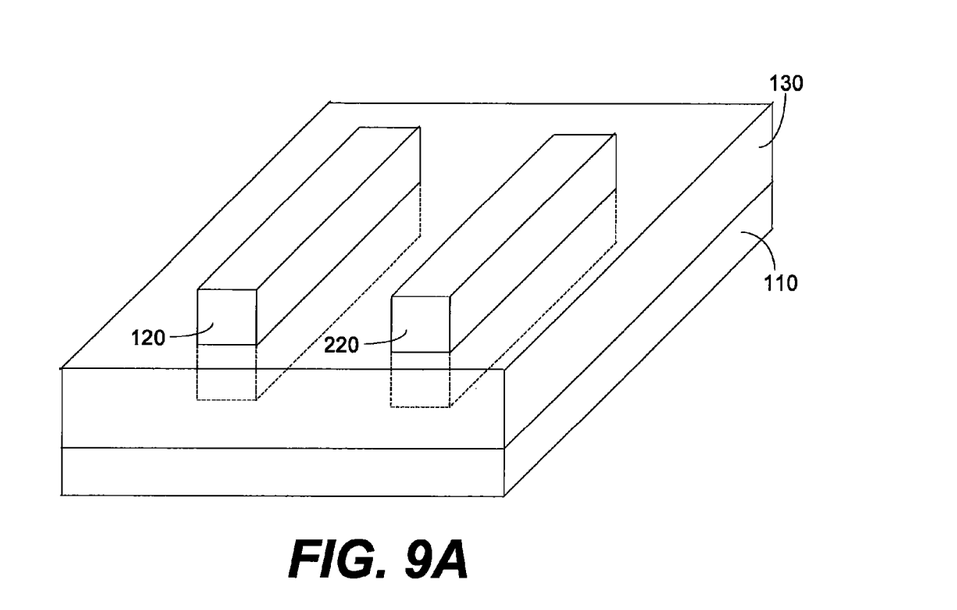
FIGS. 9A-D and 9F are schematic perspective views illustrating a method of fabricating an integrated circuit chip according to embodiments of the inventive concepts.

As shown in FIG. 9A, semiconductor bodies 120, 220 such as a semiconductor fins may be formed that extend upwardly from a semiconductor substrate 110. The semiconductor fins 120, 220 may be formed, for example, by using photolithography to form a mask (not shown) on the top surface of the semiconductor substrate 110 that covers the regions where the semiconductor fins 120, 220 are to be formed, and then anisotropically etching the semiconductor substrate 110 to recess the top surface of the semiconductor substrate 110 except for the portions of the semiconductor substrate 110 that are under the mask, thereby leaving a thinner semiconductor substrate 110 that has the semiconductor fins 120, 220 protruding upwardly therefrom. Prior to removal of the mask, an isolation layer 130 such as a shallow trench isolation may be formed on the exposed portions of the top surface of the semiconductor substrate 110 so that the isolation layer 130 covers lower portions of the sidewalls of the respective semiconductor fins 120, 220 while leaving upper portions of the sidewalls of the semiconductor fins 120, 220 exposed. The dashed lines in FIG. 9A illustrate the buried portions of the semiconductor fins 120, 220 that are surrounded by the isolation layer 130. These dashed lines are omitted in FIGS. 9B-9F to simplify the drawings.

Figure 9B:
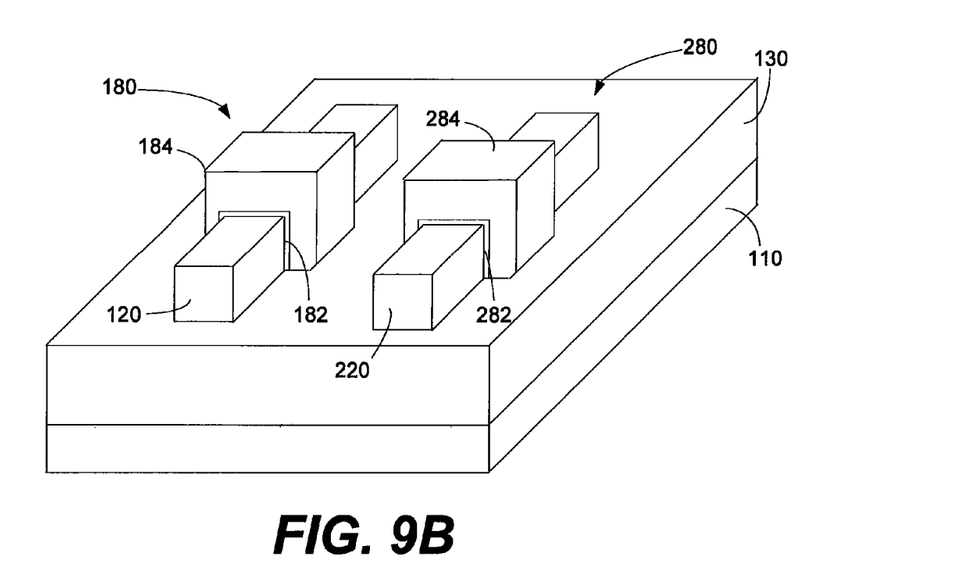

As shown in FIG. 9B, a pair of sacrificial gate structures 180, 280 may then be sequentially formed on the top surfaces and exposed sidewalls of central portions of the respective semiconductor fins 120, 220. The sacrificial gate structure 180 includes a sacrificial dielectric layer 182 and a sacrificial gate electrode 184, and the sacrificial gate structure 280 includes a sacrificial dielectric layer 282 and a sacrificial gate electrode 284. Portions of the semiconductor fins 120, 220 on either side of the sacrificial gate structures 180, 280 may then be lightly doped with impurities of a desired conductivity type (e.g., arsenic or phosphorous atoms if the semiconductor fins 120, 220 are formed of silicon and NMOS transistors are to be formed).

Figure 9C:
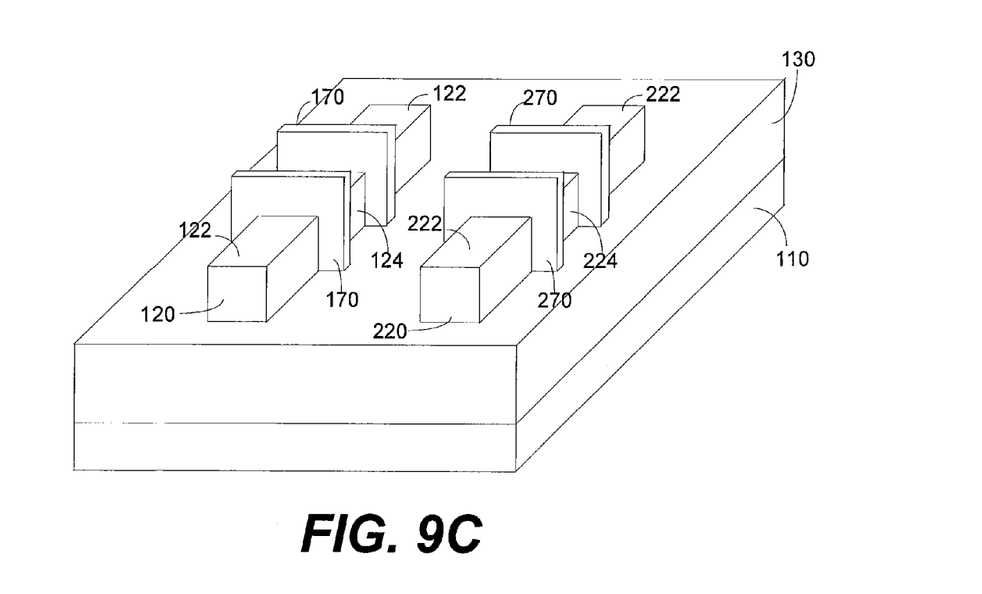

Referring to FIGS. 9B-C, sidewall spacers 170 may then be formed on either side of the sacrificial gate structure 180 and sidewall spacers 270 may be formed on either side of the sacrificial gate structure 280. The sidewall spacers 170, 270 may be formed of an insulating material such as, for example, silicon nitride. Then, source/drain regions 122 may be formed by implanting additional impurities into the exposed portions of the semiconductor fin 120 and source/drain regions 222 may be formed by implanting additional impurities into the exposed portions of the semiconductor fin 220. As the sidewall spacers 170 cover portions of the semiconductor fin 120 that are immediately adjacent to a channel region that is under the sacrificial gate structure 180, the portions of the semiconductor fin 120 underneath the sidewall spacers 170 may only be lightly doped, and hence may comprise source/drain extension regions. Likewise, portions of the semiconductor fin 220 that are underneath the sidewall spacers 270 may only be lightly doped, and hence may comprise source/drain extension regions. The exposed portions of the semiconductor fins 120, 220 may be more heavily doped and may comprise respective pairs of source/drain regions 122, 222 that are on either side of the respective sacrificial gate structures 180, 280.

Next, a dielectric layer (not shown) may be formed over the resulting structure to a thickness sufficient to cover the sacrificial gate structures 180, 280. A planarization process such as a chemical-mechanical planarization process may then be performed to planarize the dielectric layer and to expose the top surfaces of the sacrificial gate structures 180, 280. The sacrificial gate electrodes 184, 284 and the sacrificial dielectric layers 182, 282 may then be removed (e.g., by selective etching) to expose a semiconductor channel region 124 of the semiconductor fin 120 and a semiconductor channel region 224 of the semiconductor fin 220, thereby arriving at the structure depicted in FIG. 9C.

Figure 9D:
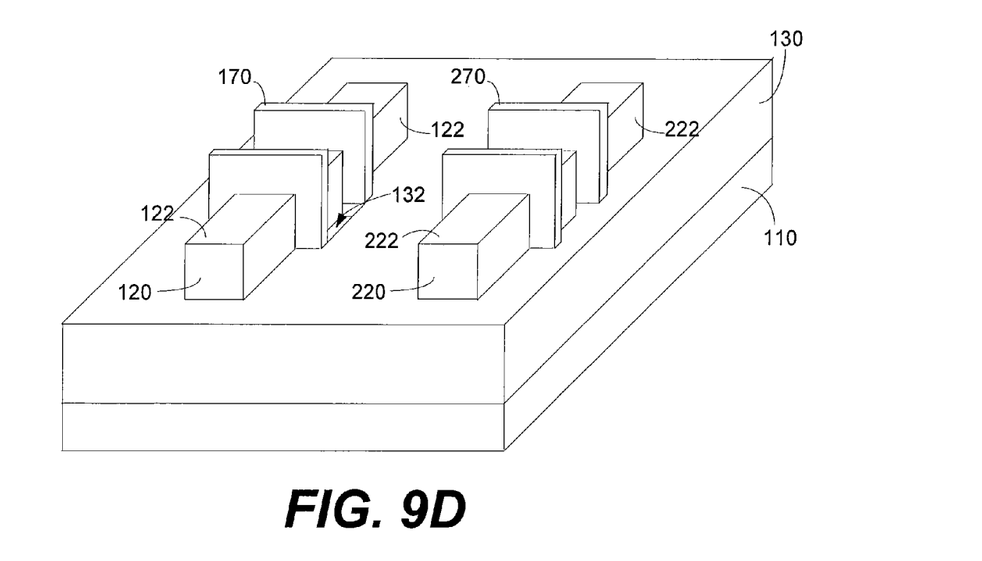

As shown in FIG. 9D, portions of the isolation layer 130 that is adjacent to either side of the channel region 124 may then be recessed by, for example, forming a mask that exposes the regions that are to be recessed and then anisotropically etching the portions of the of the isolation layer 130 that is adjacent to either side of the channel region 124 in order to form a pair of recesses 132 in the isolation layer 130 (only one of these recesses 132 is visible in FIG. 9D). The recesses 132 may be formed, for example, using a wet-etch and/or a dry-etch. No such recesses are formed adjacent to the channel region 224.

Figure 9E:
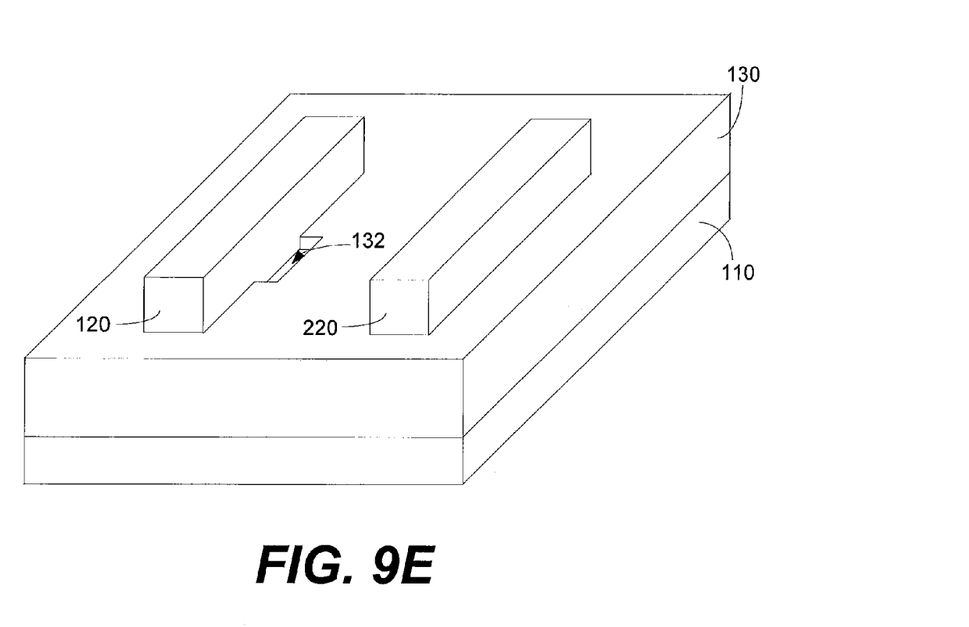
FIG. 9E is a schematic perspective view illustrating a step of an alternative method of fabricating an integrated circuit chip according to embodiments of the inventive concepts.
Figure 9F:
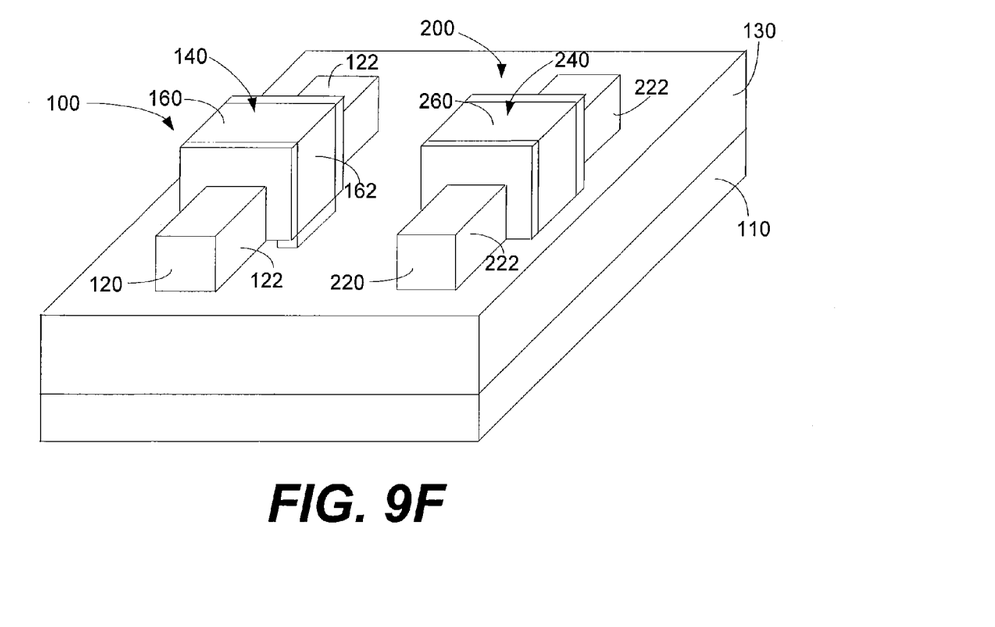

Referring to FIG. 9F, gate dielectric layers 150, 250 (not visible in the drawing) and gate electrodes 160, 260 may then be formed on the top surface and sidewalls of the respective channel regions 124, 224 between the respective sidewall spacers 170, 270. Side portions 152 of the gate dielectric layer 150 (not visible) and side portions 162 of the gate electrode 160 may extend into and fill the recesses 132 so that the gate structure 140 extends below the bottom surfaces of the source/drain regions 122. In this fashion, a first pi-gate transistor 100 and a second non-pi-gate transistor 200 may be formed on the semiconductor substrate 110.

FIG. 9A-9C and 9E-9F are schematic perspective views illustrating a method of fabricating an integrated circuit chip according to further embodiments of the inventive concepts.

After forming the semiconductor fins 120, 220 and the isolation layer 130 in the manner described above with reference to FIG. 9A, recesses 132 may be formed in either side of the isolation layer 130 adjacent a central portion of the semiconductor fin 120, as .shown in FIG. 9E. The recesses 132 may be formed, for example, using either a wet-etch or a dry-etch. Thereafter, the processing steps discussed above with reference to FIGS. 9B, 9C and 9F may be performed to fabricate the pi-gate transistor 100 and the non-pi-gate transistor 200 that are shown in FIG. 9F.

Embodiments of the inventive concepts have been described above with reference to the accompanying drawings, in which example embodiments are shown. The inventive concepts may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout the drawings and specification. As used herein the expression "and/or" includes any and all combinations of one or more of the associated listed items.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention.

It will be understood that when an element is referred to as being "coupled to" or "connected to" or "on" another element, it can be directly coupled to, connected to or on the other element or intervening elements may also be present. In contrast, when an element is referred to as being "directly coupled to" or "directly connected to" or "directly on" another element, there are no intervening elements present. Other words used to describe the relationship between elements should be interpreted in a like fashion (i.e., "between" versus "directly between", "adjacent" versus "directly adjacent", etc.).

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising", "includes" and/or "including" when used in this specification, specify the presence of stated features, elements, and/or components, but do not preclude the presence or addition of one or more other features, elements, components, and/or groups thereof Embodiments of the inventive concepts have been described above with reference to cross-section illustrations that are schematic illustrations of idealized embodiments (and intermediate structures) of the inventive concepts. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

All embodiments can be combined in any way and/or combination.

In the drawings and specification, there have been disclosed typical embodiments of the inventive concepts and, although specific terms are employed, they are used in a generic and descriptive sense only and not for purposes of limitation, the scope of the inventive concepts being set forth in the following claims.

What is claimed is:

1. An integrated circuit chip, comprising:
    a semiconductor substrate;
    a first back-end-of-line-loaded unit circuit that includes a first group of field effect transistors; and
    a second gate-loaded unit circuit that includes a second group of field effect transistors;
    wherein the first group of field effect transistors includes a first transistor and the second group of field effect transistors includes a second transistor, and
    wherein a bottom surface of a gate electrode of the first transistor extends closer to a bottom surface of the semiconductor substrate than does a bottom surface of a gate electrode of the second transistor.

2. The integrated circuit chip of claim 1, wherein the first transistor is a pi-gate transistor and the second transistor is a non-pi-gate transistor.

3. The integrated circuit chip of claim 1, wherein a gate capacitance of the first transistor exceeds a gate capacitance of the second transistor.

4. The integrated circuit chip of claim 1, wherein the leakage current of the first transistor is less than the leakage current of the second transistor.

5. The integrated circuit chip of claim 1, wherein the first transistor has a channel conduction width that is greater than a channel conduction width of the second transistor.

6. The integrated circuit chip of claim 5, wherein the first transistor includes a semiconductor fin that has a first height above the bottom surface of the substrate and the second transistor includes a semiconductor fin that has a second height above the bottom surface of the substrate that is less than the first height.

7. The integrated circuit chip of claim 1, wherein the first and second field effect transistors have the same gate length.

8. The integrated circuit chip of claim 1, wherein an effective drive current per layout area of the first transistor exceeds an effective drive current per layout area of the second transistor.

9. The integrated circuit chip of claim 1, wherein a threshold voltage of the first transistor exceeds a threshold voltage of the second transistor.

10. The integrated circuit chip of claim 1, wherein the first transistor is a pi-gate transistor and the second transistor is a pi-gate transistor.

11. The integrated circuit chip of claim 1, wherein the leakage current of the first transistor is at least five times less than the leakage current of the second transistor.

12. An integrated circuit chip, comprising:
    a semiconductor substrate;
    a first unit circuit that includes first unit cells having a first plurality of field effect transistors on the semiconductor substrate and a first plurality of interconnects that interconnect the first plurality of field effect transistors;
    a second unit circuit that includes second unit cells having a second plurality of field effect transistors on the semiconductor substrate and a second plurality of interconnects that interconnect the second plurality of field effect transistors;
    wherein a first transistor that is part of the first plurality of field effect transistors has a first gate design, and wherein more than 50% of the circuit capacitance of the first unit circuit is attributable to the first plurality of interconnects, and
    wherein a second transistor that is part of the second plurality of field effect transistors has a second gate design that is different from the first gate design, and wherein less than 50% of the circuit capacitance of the second unit circuit is attributable to the second plurality of interconnects.

13. The integrated circuit chip of claim 12, wherein the first transistor has a pi-gate design and the second transistor has a non-pi-gate design.

14. The integrated circuit chip of claim 12, wherein a gate capacitance of the first transistor exceeds a gate capacitance of the second transistor.

15. The integrated circuit chip of claim 12, wherein the leakage current of the first transistor is less than the leakage current of the second transistor.

16. The integrated circuit chip of claim 12, wherein the first transistor has a channel conduction width that is greater than a channel conduction width of the second transistor.

17. The integrated circuit chip of claim 16, wherein the first transistor includes a semiconductor fin that has a first height above a bottom surface of the substrate and the second transistor includes a semiconductor fin that has a second height above the bottom surface of the substrate that is less than the first height.

18. The integrated circuit chip of claim 12, wherein a threshold voltage of the first transistor exceeds a threshold voltage of the second transistor.

19. The integrated circuit chip of claim 12, wherein the first transistor has a first pi-gate design and the second transistor has a second pi-gate design that is different than the first pi-gate design, and wherein a bottom surface of a gate electrode of the first transistor is positioned a first distance from the bottom surface of the semiconductor substrate and a bottom surface of a gate electrode of the second transistor is positioned a second distance from the bottom surface of the semiconductor that is greater than the first distance.

20. An integrated circuit chip, comprising:
a first unit circuit that has first field effect transistors that have respective gate capacitance levels that sum to a value that exceeds a first threshold, the first field effect transistors having a first gate electrode design; and
a second unit circuit that has second field effect transistors that have respective gate capacitance levels that sum to a second value that is less than a second threshold, the second field effect transistors having a second gate electrode design that is different than the first gate electrode design.

* * * * *